United States Patent [19]

Giallorenzi

[11] 4,378,497
[45] Mar. 29, 1983

[54] OPTICAL FIBER MAGNETIC FIELD SENSOR WITH THERMAL AND ACOUSTIC ISOLATION

[75] Inventor: Thomas G. Giallorenzi, Springfield, Va.

[73] Assignee: The United States of America as represented by the Secretary of the Navy, Washington, D.C.

[21] Appl. No.: 241,289

[22] Filed: Mar. 6, 1981

[51] Int. Cl.³ .............................................. G02B 5/14
[52] U.S. Cl. ...................................... 250/227; 324/96
[58] Field of Search ............... 324/96, 244; 350/96.24, 350/96.29, 96.30, 96.31, 375–378, 355; 332/7.51; 250/227, 231 R

[56] References Cited

U.S. PATENT DOCUMENTS

| | | | |
|---|---|---|---|
| 3,645,603 | 2/1972 | Smith | 350/96.29 |
| 3,701,131 | 10/1972 | Brauser et al. | 250/227 |
| 4,147,979 | 4/1979 | Baues et al. | 324/244 |
| 4,348,587 | 9/1982 | Tangonan et al. | 250/227 |

OTHER PUBLICATIONS

"Magnetic Field Sensing with a Single-Mode Fiber" by Raleigh, Optics Letters, vol. 6, No. 1, Jan. 1981, pp. 19–21.

Primary Examiner—David C. Nelms
Attorney, Agent, or Firm—Robert F. Beers; William T. Ellis; Kenneth E. Walden

[57] ABSTRACT

An optical fiber sensor for detecting the presence of magnetic fields. Light carrying optical fibers are arranged in the form of a dual path interferometer wherein the separate paths define sensing and reference arms. The sensing arm is associated with magnetostrictive material for defining a sensing element which in the presence of a magnetic field undergoes dimensional changes to stretch the optical fiber to change its optical path length thus causing a detectable phase shift in light passing therethrough when compared with the same light passing through the optical fiber of the reference arm. The sensing element is isolated from thermal and acoustic perturbations thus permitting low frequency magnetic field detection.

18 Claims, 3 Drawing Figures

OPTICAL FIBER MAGNETIC FIELD SENSOR WITH THERMAL AND ACOUSTIC ISOLATION

BACKGROUND OF THE INVENTION

There is considerable interest in using optical fibers as the sensing element in devices such as hydrophones and microphones. The possibility of detecting weak magnetic fields by using magnetostrictive perturbations has been discussed in "Detection of Magnetic Fields Through Magnetostrictive Perturbations of Optical Fibers", *Optics Letters*, Vol. 5, No. 3, March 1980. The subject matter thereof is covered in U.S. patent application Ser. No. 223,635, filed Jan. 9, 1981. The basic principle of operation of such a sensor involves the measurement of longitudinal strain induced in an optical fiber by a dimension-changing magnetostrictive element. When the magnetostrictive material is in the presence of a magnetic field it is caused to undergo dimensional changes which stretch the optical fiber which lengthens its optical path to cause a detectable phase shift in light passing therethrough when compared to light passing through an optical fiber a reference arm which is not affected by the magnetic field.

Detection apparatus constructed according to this scheme is subject to thermal and acoustic disturbances in the vicinity of the sensing arm and this interferes with low frequency magnetic field detection. It is to this shortcoming that the present invention is directed.

SUMMARY OF THE INVENTION

The present invention relates to an optical fiber interferometer arrangement for sensing the presence of magnetic fields. It is known in the art to provide a magnetostrictive element such as nickel or metallic glass in engagement with a length of optical fiber whereby in the presence of a magnetic field the magnetostrictive element undergoes dimensional changes to longitudinally stretch the optical fiber and lengthen its optical path to cause a detectable phase shift in light passing therethrough when compared to similar light passing through a separate optical fiber defining a reference arm not affected by the presence of the magnetic field. The present invention is directed more specifically to a housing arrangement defining one or more vacuum chambers receiving elements of defining an interferometer section for isolating them from thermal and acoustic disturbances, and thereby permitting low frequency magnetic field detection. Walls forming the chambers are of non-magnetic material, and in addition to isolating the inner chamber and contents from thermal and acoustic disturbances, allow penetration by a magnetic field lines to the presence of the magnetostrictive element.

OBJECTS OF THE INVENTION

It is an object of this invention to provide and improve magnetic sensor of high sensitivity.

It is still another object of this invention to provide a light-carrying optical fiber sensor for detecting low frequency magnetic fields.

It is another object of this invention to provide in an optical fiber sensor means for isolating the sensing element from thermal and acoustic perturbations, thereby permitting low frequency magnetic field detection.

It is yet another object of this invention to provide light carrying optical fibers associated with a magnetostrictive element and arranged in the form of an interferometer which in the presence of a magnetic field acts to induce detectable phase shifts in light passing through the fibers.

Still other objects of this invention will become apparent upon detailed consideration of the present disclosure.

DESCRIPTION OF THE PREFERRED EMBODIMENTS

Figure 1:
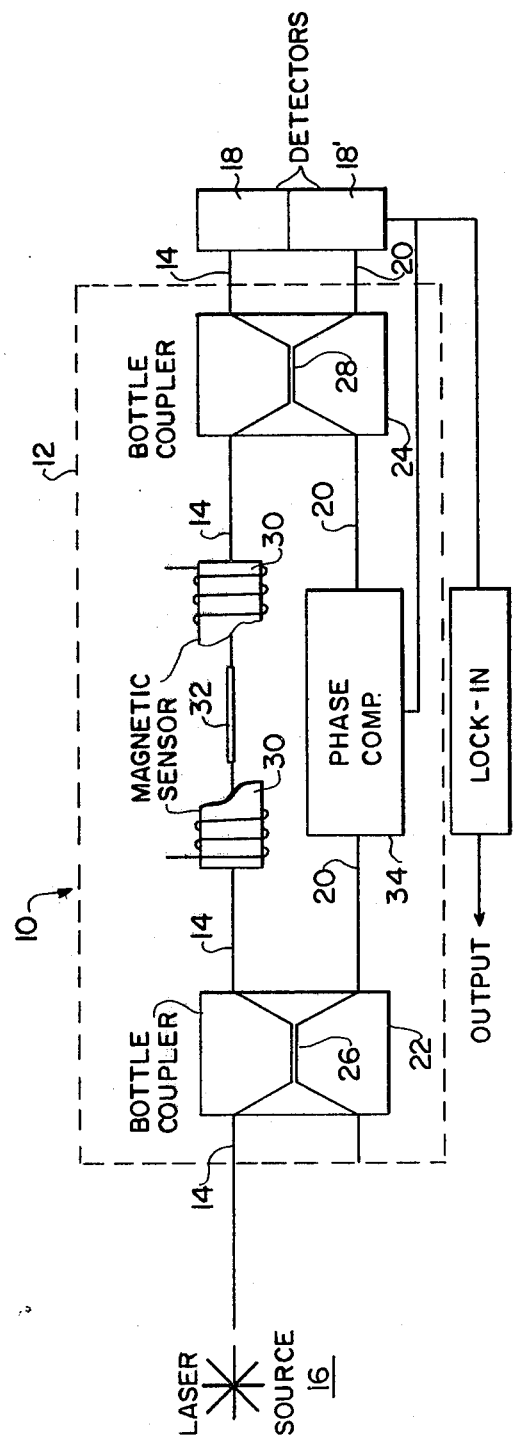
FIG. 1 is a diagrammatic representation of an optical fiber interferometer for sensing magnetically induced phase shifts of light passing through the arms thereof.

Referring now to the drawings, wherein like numerals identify like parts or features throughout the several figures, there is shown in FIG. 1 a diagrammatic representation of an optical fiber magnetic sensor 10, a portion of which is arranged in the form of a double path fiber interferometer section 12 enclosed by a dashed line. The dashed line encloses that portion of the sensor which is preferably isolated from thermal and acoustic conditions according to the teaching of the present invention. Apparatus for isolating this section will be described hereinafter in considerable more detail with reference to FIGS. 2 and 3.

Optical fiber 14 including a single mode optic core and surrounding cladding. It receives light from laser source 16 and transmits it through one path to detector 18. Another optical fiber 20 is adapted to transmit the same light to detector 18' after it has been coupled into optical fiber 14 at couplers 22 and 24 for sharing light from the laser source. Coupling or equal power dividing of light from one optical fiber to another is accomplished by providing the optical fibers in close adjacency along coextensive lengths 26 and 28 in couplers 22 and 24 respectively. Optical cladding along these coextensive lengths have been reduced in thickness to around one to two microns whereby light is intentionally leaked or divided from one optical fiber to another by what is known as evanescent field coupling. For a more detailed discussion regarding evanescent field coupling and a disclosure of one invention thereto (bottle coupler), attention is invited to U.S. patent application, Ser. No. 11,976, filed Feb. 14, 1979, and now issued as U.S. Pat. No. 4,264,126. Optical fibers 14 and 20 between couplers 22 and 24 take separate optical paths to define, respectively, a magnetic sensing arm and a reference arm. Since couplers 22 and 24 divide power equally between optical fibers 14 and 20, either optical path may be used as the sensing arm and the other used as the reference arm. In the arrangement shown in FIG. 1, a length of optical fiber 14 defines the magnetic sensing arm and a length of optical fiber 20 defines the reference arm. These fibers are of substantial length as may be required depending upon their transmitting properties and intended service. A length of optical fiber 14 is associated with magnetostrictive material, such as nickel, in the form of a bar or thin-walled cylinder 30. The fiber may be secured thereto by being wrapped helically about its peripherical surface as shown in FIG. 1. An alternative arrangement also suggested in FIG. 1 provides a length of magnetostrictive material 32 in the form of a jacket which has been applied to otherwise secured to optical fiber 14 over an extended length. When a magnetostrictive element is introduced into the presence of a varying magnetic field, it undergoes dimensional changes in response to the field. Since the optical fiber, typically made of silica or other appropriate glass, is secured to the magnetostrictive element, dimensional changes of the element strain the optical fiber, thus causing a change in its index of refraction and a lengthening of its optical path. These changes cause a corresponding phase-shift on light passing through that length of the fiber. Generally, these two changing conditions oppose each other, but the optical path length change is considerably more dominant. Optical fiber 20 is connected with a phase compensator 34 controlled from detector 18' for selectively shifting the phase of light passing therethrough. Optical fiber 20 as previously described is coupled into optical fiber 14 and coupler 22 and equally shares the light from laser source 16. Therefore, light propagating through the two separate paths is of like frequency and in-phase. The phase shift induced on light passing through the sensing arm by the action of the magnetostrictive element 30 or 32 in the presence of a magnetic field is passed through coupler 24 where it is recombined with a phase of light having passed through the reference arm without phase shift except for that selectively applied by phase compensator 34. Their combined phases are detected by detector 18 and demodulated to recover the signal. The phase compensator, usually a piece of piezoelectric material is used to selectively shift the phase in its optical fiber for increased sensitivity at detector 18. Accordingly, there is read at the output a phase shift responsive to the magnitude of the magnetic field. Phase compensator 34 provided in the reference arm is connected to a phase tracking feedback circuit (not shown). The phase tracker is required to track out thermally induced phase shifts in the fiber, and performs well as long as the magnetic frequency to be detected lies above the characteristic noise spectra of thermally induced noise. The characteristic noise spectra of thermally induced noise usually expands the frequency range from 0 up to as 50 Hz depending on the optical fiber and cladding. It is desired that the sensor be sensitive to magnetic signals in the low frequency range. Conventional state of the art equipment is not able to track out thermal noise when the noise spectra overlaps this magnetic signal range. Consequently, the thermal noise spectrum must be limited to the low frequency magnetic signals are to be detected. The following description is directed to arrangements for reducing the noise spectrum by providing thermal and acoustic isolation and stabilization.

Figure 2:
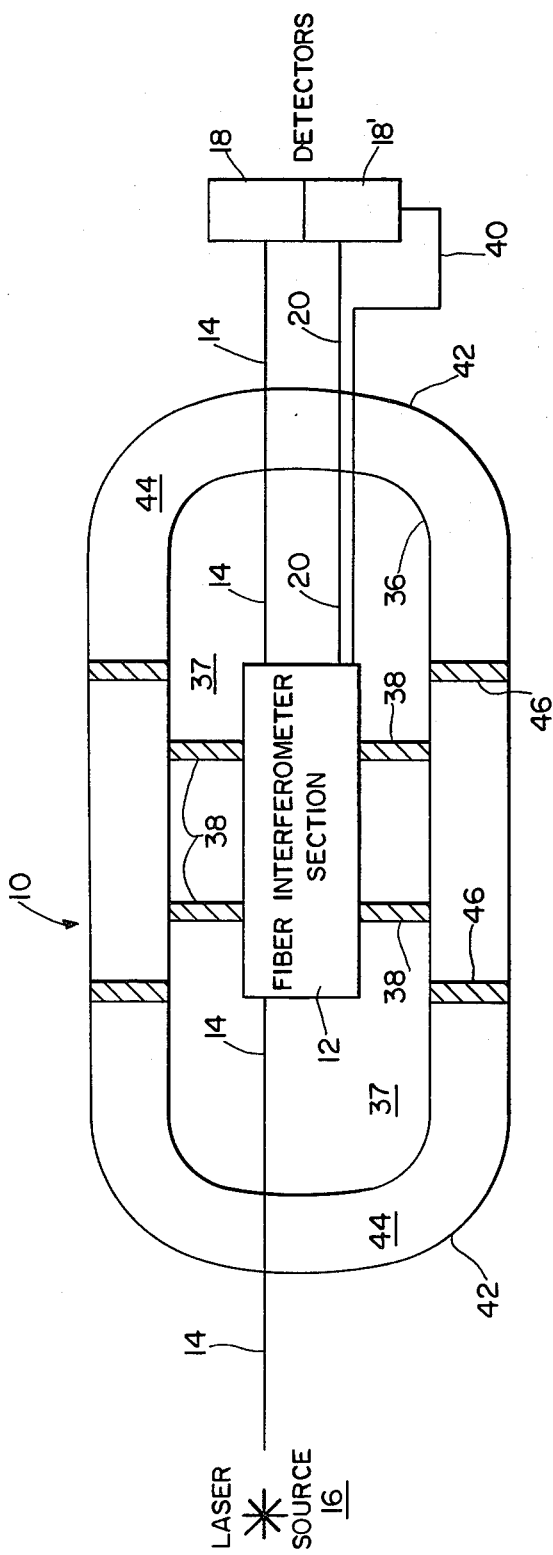
FIG. 2 is a cross-sectional representation of a thermos housing for receiving the interferometer sensing apparatus in thermal and acoustic isolation.

Referring now to FIG. 2, there is shown a housing having walls surrounding and enclosing the interferometer section 12 and isolating it from surrounding environment. Its purpose is to maintain the interferometer section, particularly the sensor, at maximum sensitivity by nulling low frequency perturbations such as arise from temperature variations and air and water current induced acoustic disturbances. FIG. 2 shows interferometer 12 centrally disposed within an isolating means such as a vacuum chamber. Section 12 is supported from the inside of inner wall 36 which enclose a hermetically sealed chamber 37 containing a vacuum. Support members 38 are preferably formed of a material having very poor thermal conductivity and may, for example, take the shape of thin walled tubes. Laser optical source 16 is preferably placed outside the vacuum chamber, as shown in FIG. 2, and optical fiber 14 leads therefrom through a sealed opening in wall 36 to the interferometer section. Optical fibers 14 and 20 emerge from the interferometer section and exit through wall 36 to detectors 18 and 18'. Optical fiber 40 provides a feedback line in which the phase tracking signal generated in the feedback electronic circuit (not shown) is transferred back to the reference arm optical fiber. The interferometer section comprises the optical fiber lengths or coils (not illustrated) defining the sensing the reference arms, two db couplers and a phase compensator reference element as illustrated in FIG. 1. Detectors 18 and 18' may be located either within the interferometer section or outside the housing walls as illustrated in FIG. 2.

Figure 3:
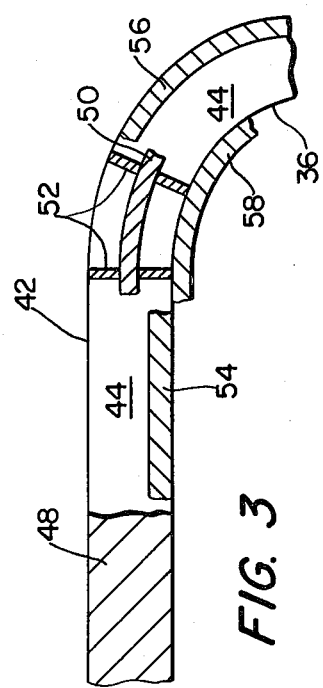
FIG. 3 is a cross-sectional representation through the walls of the vacuum chamber showing alternate isolating embodiments.

An outer wall 42 completely surrounds and is spaced outwardly from wall 36. This wall may define a second hermetically sealed chamber 44 which is adapted to contain a vacuum. In this event, support members 46, of poor thermal and acoustic transmission properties, are provided to extend between the walls maintain their separation. If wall 44 is chosen not to provide a sealed vacuum chamber 44 outside of walls 36, the space therebetween must be at least partially filled with a material having poor thermal and acoustic transmitting qualities. Several alternatives for insulating and isolating vacuum chamber walls 36 and 42 is illustrated in FIG. 3. Thermo-acoustic material 48 may either completely fill the space between the walls or be maintained as a thin section 50 spaced therebetween by supports 52. In another arrangement, thin sections of thermo-acoustic material 54 or 56 may be secured to walls 36 or 42 forming chamber 44. Still another arrangement is that a thin section of thermo-acoustic material 58 may be secured to wall 36 inside the vacuum chamber. These walls including vacuum spaces and thermo-acoustic materials define isolating means for minimize thermal and acoustic disturbances from reaching the interferometer section. The housing defined herein can be arbitratily formed in numerous shapes, for example, long linear tubes, round or oval bulbs or circular tubes, for containing the interferometer section.

There have been described an arrangement for providing significant thermal and acoustic isolation of the interferometer section for reducing thermal noise spectrum to low frequencies to null out low frequency noise in the frequency band range of magnetic signals to be detected. The noise spectrum is simply reduced below the signal frequency band. Isolating the optical fiber interferometer section for the advantages described herein has equal application to optical accelerometers and optical fiber gyroscopes.

While the invention has been particularly shown and described with reference to specific embodiments, it will be understood by those skilled in the art that various changes in form and detail may be made thereto without departing from the spirit of the invention which is limited only by the scope of the claims herein.

What is claimed is:
1. A magnetic field sensor comprising:
optical fiber means for carrying light from a laser source;
magnetostrictive means associated with a length of the optical fiber means for defining a sensing element;
said magnetostrictive means in the presence of a magnetic field undergoes responsive dimensional changes to stretch the optical fiber for effecting light passing therethrough by causing a phase shift detectable by interferometry;

means pervious to magnetic field lines isolating the sensing element from thermal and acoustic perturbations thereby permitting low frequency magnetic field detection.

2. The invention according to claim 1 wherein the isolating means surrounds the sensing element.

3. The invention according to claim 2 wherein the surrounding isolating means comprises first wall means defining a first hermetically sealed chamber enclosing a vacuum.

4. The invention according to claim 2 wherein the isolating means comprises a vacuum chamber.

5. The invention according to claim 3 or 4 further defined by including means supporting the sensing element within and spaced from the first wall means of the sealed chamber.

6. The invention according to claim 5 wherein the means supporting the sensing element has low thermal conductivity.

7. The invention according to claim 2 or 3 further defined by means surrounding the isolation means for further isolating the sensing element from thermal and acoustic perturbations.

8. The invention according to claim 7 wherein the further isolating means comprises second wall means spaced outwardly from the first wall means defining the first hermetically sealed chamber.

9. The invention according to claim 8 wherein material of low thermal and acoustic transmission properties is disposed between the first and second wall means.

10. The invention according to claim 8 wherein the first and second wall means define therebetween a second hermetically chamber surrounding the first hermetically sealed chamber for further isolating the sensing element from thermal and acoustic perturbations.

11. The invention according to claim 8 further defined by support means between the first and second wall means maintaining their separation.

12. The invention according to claim 11 wherein the support means is of a material having poor thermal and acoustic transmission qualities.

13. The invention according to claim 1 wherein the sensing element comprises an elongate magnetostrictive element jacketing a length of the optical fiber means disposed internally of the isolating means.

14. The invention according to claim 1 wherein the sensing element comprises an elongate cylindrical bar of magnetostrictive material around which is helically wrapped a length of the optical fiber means disposed within the isolating means.

15. A system for detecting a magnetic field comprising:

a laser light source and a light detector means spaced therefrom;

a pair of optical fibers, one defining a sensing arm and the other defining a reference arm, each communicating light from the light source to the detector means;

magnetostrictive means associated with a length of the optical fiber in the sensing arm defining a sensing element whereby in the presence of a magnetic field the magnetostrictive means undergoes dimensional change to stretch the fiber longitudinally to lengthen its optical path to cause a detectable phase shift in light traveling therethrough compared with light traveling through the reference arm; and means pervious to ingress of magnetic field lines substantially surrounding the sensing element for isolating it from thermal and acoustic perturbations thereby permitting low frequency magnetic field detection.

16. The invention according to claim 15 further defined by the isolating means comprising a chamber enclosing a vacuum in which the sensing element and portions of the optical fibers defining the sensing are reference arms are disposed.

17. The invention according to claim 16 further defined by the vacuum chamber also enclosing the light detector means.

18. The invention according to claims 16 or 17 wherein first wall means defines a hermetically sealed chamber enclosing the vacuum and second wall means surround the first wall means defines a hermetically sealed chamber enclosing a second vacuum about the first wall means.

* * * * *